(12) United States Patent
Ito

(10) Patent No.: US 7,291,879 B2
(45) Date of Patent: Nov. 6, 2007

(54) SEMICONDUCTOR MEMORY DEVICE INCLUDING CAPACITOR WITH CONDUCTIVE HYDROGEN DIFFUSION PREVENTION WIRING FILM

(75) Inventor: Toshio Ito, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/155,609

(22) Filed: Jun. 20, 2005

(65) Prior Publication Data

US 2006/0076594 A1 Apr. 13, 2006

(30) Foreign Application Priority Data

Sep. 30, 2004 (JP) ............................. 2004-288736

(51) Int. Cl.
*H01L 27/108* (2006.01)
*H01L 29/76* (2006.01)
*H01L 29/94* (2006.01)
*H01L 31/119* (2006.01)

(52) U.S. Cl. .................. 257/296; 257/306; 257/310; 257/E27.086

(58) Field of Classification Search ........ 257/295–296, 257/303, 306, 310, E27.086, E27.087, E27.088
See application file for complete search history.

(56) References Cited

U.S. PATENT DOCUMENTS

| 6,355,952 B1 * | 3/2002 | Yamoto et al. ............. 257/295 |
| 6,396,092 B1 * | 5/2002 | Takatani et al. ............ 257/295 |
| 2005/0051821 A1 | 3/2005 | Miki et al. |

FOREIGN PATENT DOCUMENTS

WO WO 9831053 7/1998

* cited by examiner

*Primary Examiner*—Hoai Pham
(74) *Attorney, Agent, or Firm*—Volentine & Whitt, P.L.L.C.

(57) ABSTRACT

The present invention provides a semiconductor memory device which comprises an interlayer insulating film formed on a semiconductor substrate, a contact plug formed in the interlayer insulating film and having one end electrically connected to the semiconductor substrate, a ferroelectric capacitor formed on the interlayer insulating film and comprising a first electrode, a ferroelectric film and a second electrode electrically connected to the other end of the contact plug, an insulating film which covers the ferroelectric capacitor and has an opening that exposes the first electrode, and a wiring film which covers the ferroelectric capacitor and the insulating film and is electrically connected to the first electrode exposed through the opening and which consists of a material having conductivity and even a hydrogen diffusion preventing function.

16 Claims, 17 Drawing Sheets

SEMICONDUCTOR MEMORY DEVICE INCLUDING CAPACITOR WITH CONDUCTIVE HYDROGEN DIFFUSION PREVENTION WIRING FILM

BACKGROUND OF THE INVENTION

1. Field of the Invention

The present invention relates to a semiconductor memory device, and particularly to a semiconductor memory device equipped with a ferroelectric capacitor.

2. Description of the Related Art

It has generally been known that a ferroelectric film is subject to degradation of its electric characteristic due to the intrusion and diffusion of a hydrogen gas in various steps subsequent to the formation of a ferroelectric capacitor. Therefore, it has heretofore been practiced to prevent the electric characteristic of the ferroelectric film by covering of the ferroelectric capacitor with a film (hydrogen diffusion preventing film) for preventing the intrusion and diffusion of the hydrogen gas into the ferroelectric film.

FIG. 1 is a diagram showing a structure of a ferroelectric capacitor shown in a non-patent document 1 (Yong Tak Lee, and eight other persons, "Effects of Encapsulating Barrier Layer on Ferroelectric Properties of Ir/IrO$_2$/PZT/Pt/IrO$_2$ Capacitor", Extended Abstracts of the 1999 International Conference on Solid State Devices and Materials, Tokyo, 1999, (Japan), p. 394-395, 1999). In FIG. 1, in order to prevent degradation of an electric characteristic of a ferroelectric film 43, a structure is adopted wherein a ferroelectric capacitor 40 is covered with a hydrogen diffusion preventing film 35 in which TiO$_2$ and Al$_2$O$_3$ (Alumina) are laminated (see FIG. 1).

As ones available as a material for "a film which substantially does not adsorb hydrogen", may be mentioned, silver, aluminum, silicon, lead, bismuth, etc. As ones available as a material for "a film which substantially prevents the diffusion of the hydrogen molecules", may be mentioned, tungsten, conductive oxides, etc. (see a patent document 1 (US Pub. No. US 2005/0051821 A1 (column [0012] to [0013]), which is a counterpart of International Patent Publication No. WO98/31053).

Since, however, there is a need to form a wiring layer 51 connected to an electrode of the ferroelectric capacitor after the deposition of the hydrogen diffusion preventing film 35 in the case of the related art, an additional process step for growing the hydrogen diffusion preventing film is required (see FIG. 1).

SUMMARY OF THE INVENTION

Thus, the present invention has been made in view of the foregoing. It is therefore an object of the present invention to provide a semiconductor memory device equipped with a ferroelectric capacitor having a structure capable of preventing the diffusion of hydrogen into a ferroelectric film without the need for an additional process step.

A summary of a representative one of the inventions will be explained as follows:

The present invention provides a semiconductor memory device comprising an interlayer insulating film formed on a semiconductor substrate; a contact plug formed in the interlayer insulating film and having one end electrically connected to the semiconductor substrate; a ferroelectric capacitor formed on the interlayer insulating film and comprising a first electrode, a ferroelectric film and a second electrode electrically connected to the other end of the contact plug; an insulating film which covers the ferroelectric capacitor and has an opening that exposes the first electrode; and a wiring film which covers the ferroelectric capacitor and the insulating film and is electrically connected to the first electrode exposed through the opening and which consists of a material having conductivity and even a hydrogen diffusion preventing function.

According to the present invention, the ferroelectric capacitor and the insulating film are covered with the wiring film consisting of the material having conductivity and even the hydrogen diffusion preventing function. Thus, the wiring film is capable of carrying out both functions of the hydrogen diffusion preventing function and wiring in the related art. Consequently, the intrusion and diffusion of hydrogen into the ferroelectric film can be prevented without the need for the additional process step for depositing or growing the hydrogen diffusion preventing film.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying figures. Incidentally, the shape, size and layout relationship of each constituent element in the figures are merely approximate illustrations to enable an understanding of the present invention. The present invention is by no means limited by those.

First Preferred Embodiment

A semiconductor memory device according to a first embodiment of the present invention and its manufacturing method will be explained using FIGS. 2 through 17. Incidentally, FIGS. 2 through 10 show cross-sectional, plan or perspective views showing the semiconductor memory device according to the first embodiment, and FIGS. 11 through 17 show cross-sectional views taken every manufacturing process steps of the semiconductor memory device according to the first embodiment.

[Structure]

Figure 2:
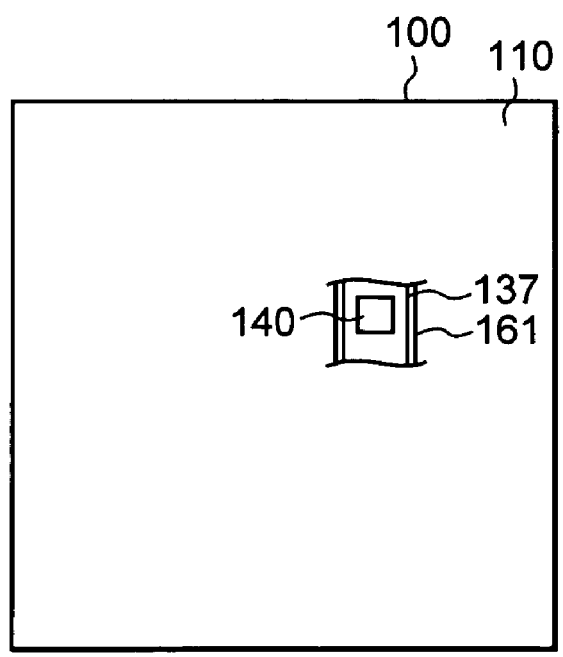
FIG. 2 is a plan view illustrating a semiconductor memory device according to a first embodiment.

FIG. 2 is a plan view showing a state in which a ferroelectric capacitor 140 formed on an interlayer insulating film 110 provided on a semiconductor substrate 100, and an insulating film 137 that covers the ferroelectric capacitor 140 are covered by a wiring film 161. The figure shows a state in which the wiring film 161 covers at least one ferroelectric capacitor 140. Incidentally, ferroelectric capacitors other than one ferroelectric capacitor 140 shown in the figure may be disposed in any position ever so many. The wiring film 161 is capable of collectively covering the ferroelectric capacitors other than the illustrated ferroelectric capacitor 140 in accordance with arbitrary wiring patterns necessary for the semiconductor memory device.

Figure 3:
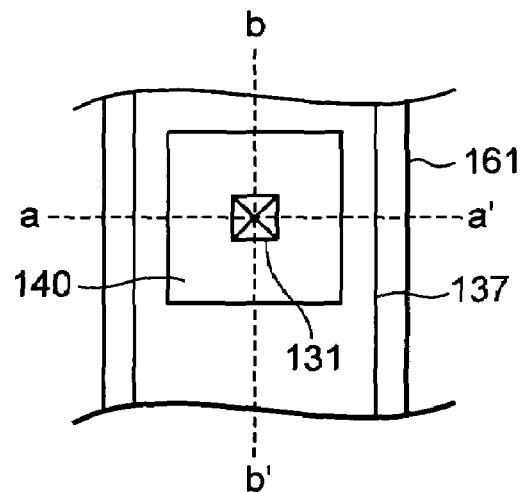
FIG. 3 is an enlarged view of FIG. 2.

FIG. 3 is an enlarged view showing a state in which the wiring film 161 shown in FIG. 2 has covered the ferroelectric capacitor 140 and the insulating film 137. The figure shows a state in which the wiring film 161 covers at least one ferroelectric capacitor 140. Now, the wiring film 161 may cover one or more other ferroelectric capacitors other than the illustrated ferroelectric capacitor 140 in accordance with desired wiring patterns or may be extended as it is without covering other ferroelectric capacitors to form each wiring pattern. Further, a contact plug may be provided at an arbitrary portion on the wiring film 161 so as be electrically connected to an upper wiring layer.

Figure 4:
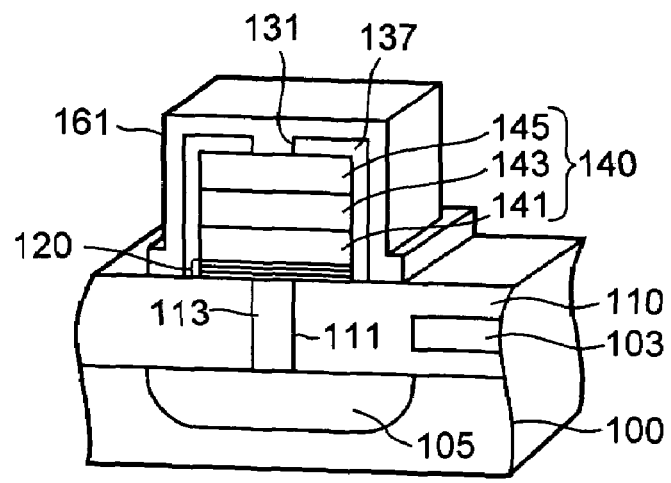
FIG. 4 is a perspective view including a cross-sectional view taken along line a-a' of FIG. 3.
Figure 5:
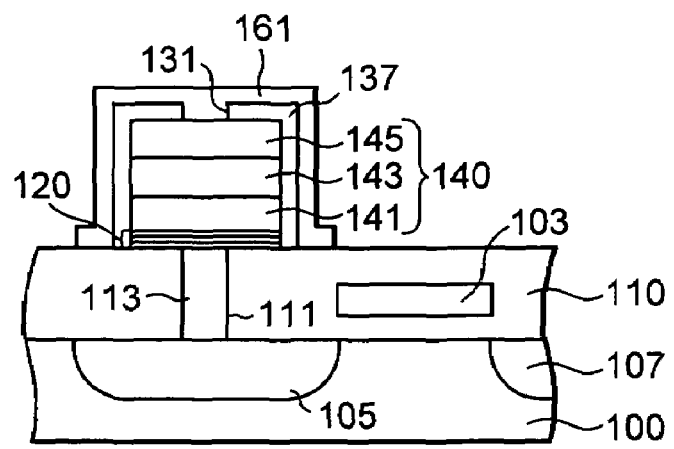
FIG. 5 is a cross-sectional view taken along line a-a' of FIG. 3.
Figure 6:
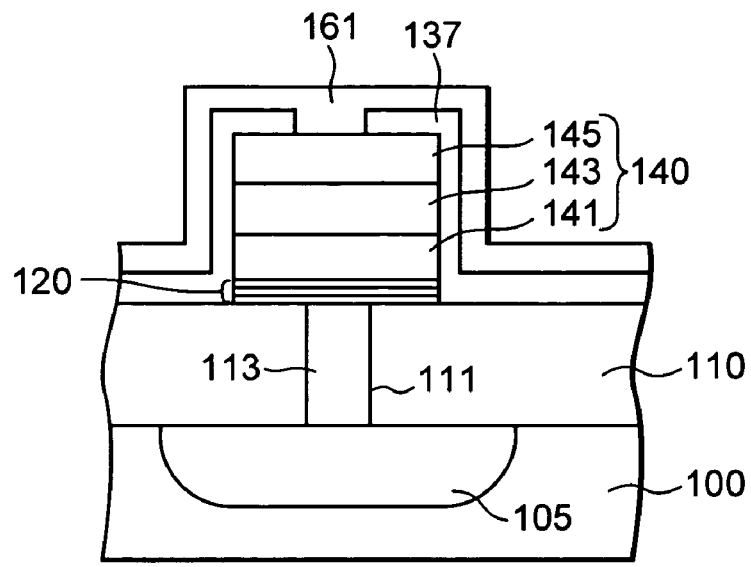
FIG. 6 is a cross-sectional view taken along line b-b' of FIG. 3.

FIG. 4 is a perspective view including a cross-sectional view taken along line a-a' of FIG. 3, FIG. 5 is a cross-sectional view taken along line a-a' of FIG. 3, and FIG. 6 is a cross-sectional view taken along line b-b' of FIG. 3, respectively. A structure of the ferroelectric capacitor according to the first embodiment will be described below using FIG. 5.

A source/drain region 105 and a drain/source region 107 of a access transistor are formed in the semiconductor substrate 100.

An interlayer insulating film 110 is formed on the semiconductor substrate 100. A contact plug 113 whose one end is electrically connected to the semiconductor substrate 100, is formed in the interlayer insulating film 110. That is, the contact plug 113 whose one end is electrically connected to the source/drain region 105 of the access transistor, is formed in the interlayer insulating film 110 formed on the semiconductor substrate 100. While polysilicon is being used as the material for the contact plug 113, tungsten may be used.

A ferroelectric capacitor 140, which comprises a first electrode 145, a ferroelectric film 143 and a second electrode 141 electrically connected to the other end of the contact plug 113, is formed on the interlayer insulating film 110.

Incidentally, although platinum (Pt), strontium bismuth tantalate ($SrBi_2Ta_2O_9$: SBT), and platinum (Pt) are used as the first electrode, the ferroelectric film and the second electrode respectively, lead zirconate titanate ($PbZr_xTi_{1-x}O_3$: PZT) may be used as the ferroelectric film. Desirably, an adhesive layer 120 may be provided between the contact plug 113 and the second electrode 141. TiAlN, Ir and $IrO_2$ may be laminated from below in that order as the adhesive layer 120.

Figure 7:
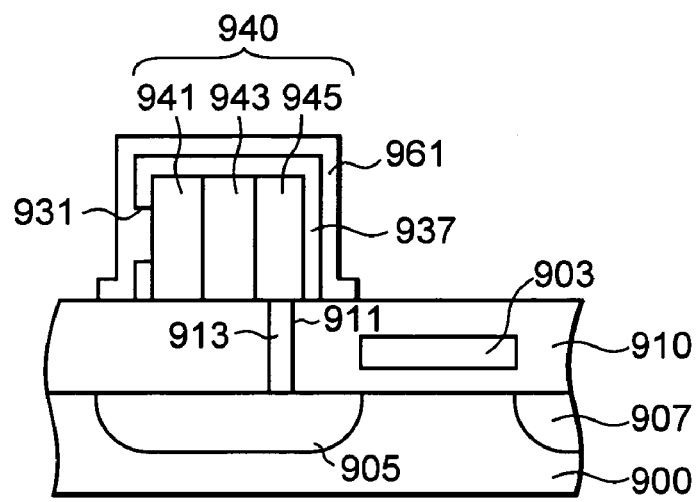
FIG. 7 is a cross-sectional view showing other configuration of a ferroelectric capacitor 140.

The second electrode 141, the ferroelectric film 143 and the first electrode 145 may be formed in order from below as shown in FIG. 5 as each ferroelectric capacitor 140. Alternatively, a first electrode 941, a ferroelectric film 943 and a second electrode 945 may be formed in order from left as shown in FIG. 7. In the present embodiment, a description will be made of a case in which the ferroelectric capacitor 140 is formed as shown in FIG. 5.

An insulating film 137, which covers the ferroelectric capacitor 140 and has an opening 131 that exposes the first electrode 145, is formed. Silicon dioxide ($SiO_2$) is used as the insulating film 137.

Figure 8:
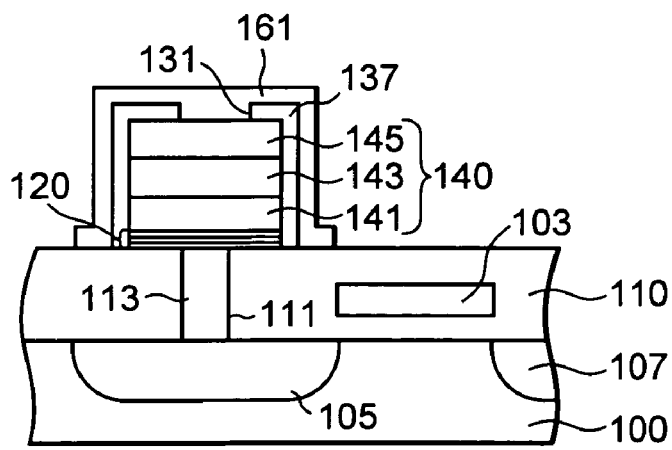
FIG. 8 is a cross-sectional view illustrating other configuration of an opening 131.
Figure 9:
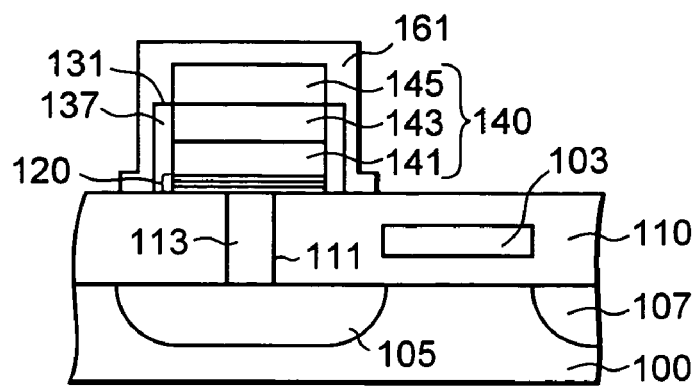
FIG. 9 is a cross-sectional view depicting another configuration of the opening 131.

Now, the term "the opening that exposes the first electrode" in the present specification means that the opening 131 exposes all or some of the first electrode 145. That is, the opening 131 may take any position, size and range so long as it exposes all or some of the first electrode 145. Described specifically, the opening may be formed in a position lying slightly in the right direction as compared with the opening 131 shown in FIG. 5 and in a slightly large size as shown in FIG. 8. Alternatively, the opening may be formed so as to expose all of the first electrode 145 as shown in FIG. 9.

Incidentally, the opening 131 is provided so as not to expose sidewalls of the ferroelectric film 143 and sidewalls of the second electrode 141. This is because when a wiring film 161 constituted of aluminum or the like to be described later makes contact with the ferroelectric film 143, the wiring film 161 and the ferroelectric film 143 react with each other due to annealing or the like corresponding to a subsequent process step, and when the wiring film 161 makes contact even with the second electrode 141, the first electrode 145 and the second electrode 141 are short-circuited.

Then, the ferroelectric capacitor 140 and the insulating film 137 are covered by the wiring film 161. The wiring film 161 is electrically connected to the first electrode 145 exposed through the opening 131. That is, the wiring film 161 and the first electrode 145 may be electrically connected to each other by direct connection of the wiring film 161 and the first electrode 145. Alternatively, as will be described later, the first electrode 145 and the wiring film 161 may be electrically connected to each other in a state in which another conductive layer is being interposed between the first electrode 145 and the wiring film 161. Also they may be electrically connected to each other in a state in which the opening 131 is filled with other conductive member (hereinafter similar in the present specification). Further, the wiring film 161 is made up of a material having conductivity and a hydrogen diffusion preventing function. In the present embodiment, aluminum (Al) was used as such a wiring film. Incidentally, although even pure aluminum may be used as the material for the wiring film, aluminum may preferably be formed as a principal component to such a degree that it can be used in the normal wiring. As such a wiring material, may be mentioned, for example, an aluminum silicon (AlSi) alloy containing silicon (Si) of 1-2 at.%, further, an aluminum silicon copper (AlSiCu) alloy added with copper (Cu) by 0.5-1.0 at %, etc. (hereinafter similar in the present specification).

The wiring film 161 formed in this way is capable of playing wiring roles of various functions. However, in a ferroelectric memory in particular, the wiring film 161 can be used as a plate line. Incidentally, the term "plate line" in the present specification means a wiring for writing information by application of a voltage to the ferroelectric capacitor.

Figure 10:
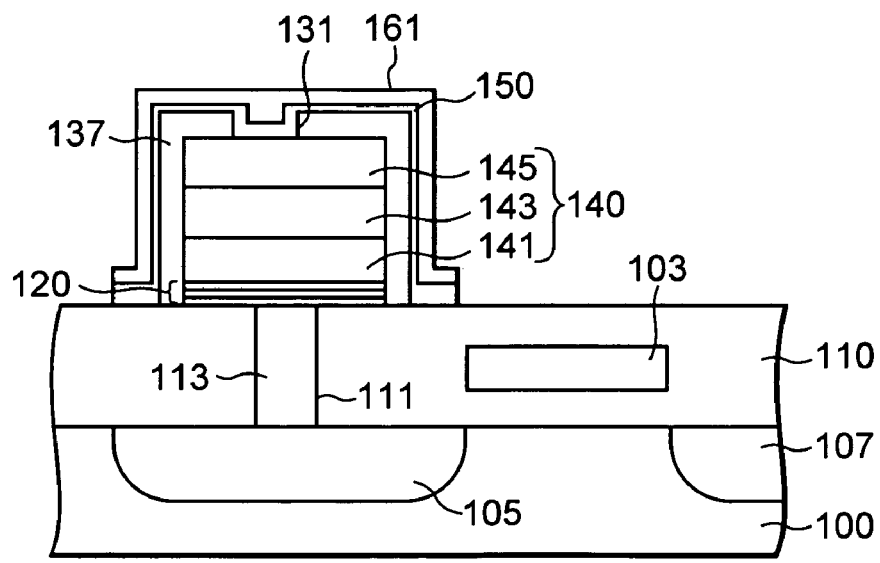
FIG. 10 is a cross-sectional view showing an example in which a barrier layer 150 is provided between an insulating film 137 and a wiring film 161.

As shown in FIG. 10, a barrier layer 150 may be provided between the insulating film 137 and the wiring film 161. The barrier layer may be provided between the first electrode 145 and the wiring film 161 at the opening 131. Titanium nitride was used as the barrier layer.

According to the semiconductor memory device according to the first embodiment, firstly, the wiring film 161 carries out both functions of the hydrogen diffusion preventing film and the wiring. Therefore, the intrusion and diffusion of hydrogen into the ferroelectric film can be prevented without the need for an additional process step for depositing or growing the hydrogen diffusion preventing film.

That is, since the wiring film 161 has conductivity and is electrically connected to the first electrode 145, it carries out the wiring function by collectively covering even other ferroelectric capacitors each comprising a similar structure. Since the wiring film 161 is made up of the material having the hydrogen diffusion preventing function and covers the ferroelectric capacitor, the intrusion and diffusion of hydrogen into the ferroelectric film at a process step subsequent to the formation of the wiring film can be prevented.

Figure 1:
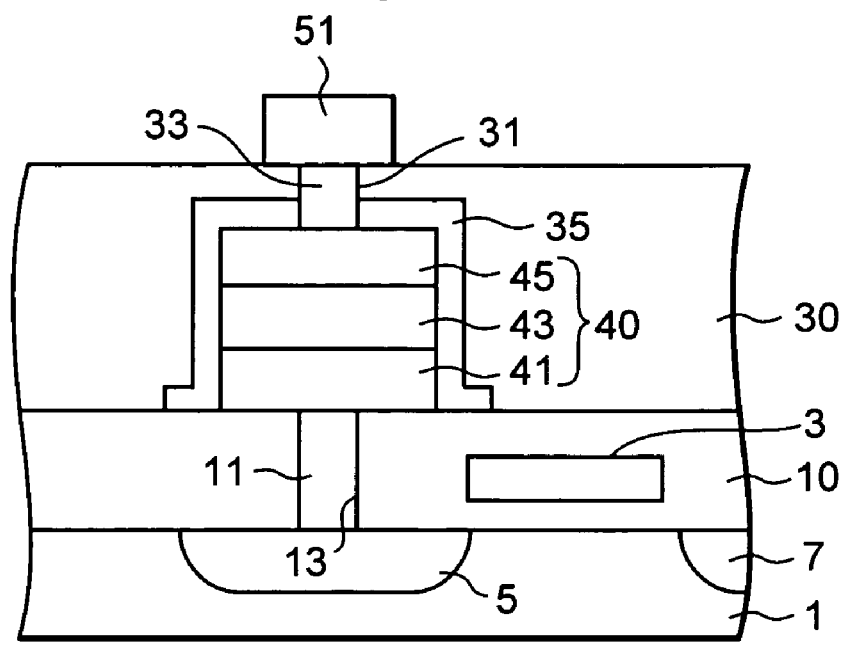
FIG. 1 is a cross-sectional view showing a semiconductor memory device described in a non-patent document 1.

The number of layers necessary up to the formation of a first metal wiring layer after the formation of a ferroelectric capacitor is set as follows where compared specifically. As the premise of the related art, firstly an interlayer insulating film is formed, secondly a contact plug is formed and thirdly a wiring (first metal wiring layer) is formed after the formation of a ferroelectric capacitor constituted of a first electrode, a ferroelectric film and a second electrode in order to form a structure unprovided with a hydrogen diffusion preventing film. Thus, the three layers are required in total. On the other hand, when the related art described in the non-patent document 1 is used to prevent the intrusion and diffusion of hydrogen into the ferroelectric film, firstly the hydrogen diffusion preventing film 35 is formed, secondly the interlayer insulating film 30 is formed, thirdly the contact plug 33 is formed and fourthly the wiring 51 (first metal wiring layer) is formed after the formation of the ferroelectric capacitor 40 constituted of the first electrode, ferroelectric film and second electrode. Thus, the four layers are required in total (see FIG. 1). This means that one layer is additionally required as compared with the above structure taken as the premise of the related art in order to prevent the intrusion and diffusion of hydrogen into the ferroelectric film. In the case of the first embodiment of the present invention in contrast to these, it is enough if firstly the insulating film 137 is formed and secondly the wiring film 161 (first metal wiring layer) is formed after the formation of the ferroelectric capacitor 140 comprising the first electrode, the ferroelectric film and the second electrode. Therefore, the two layers are enough in total (see FIG. 5). This means that one layer can be reduced in number as compared with the structure based on the premise of the related art unprovided with the hydrogen diffusion preventing film, and the two layers can be reduced in number as compared with the related art described in the non-patent document 1 provided with the hydrogen diffusion preventing film.

Secondly, the ferroelectric capacitor is first covered with the hydrogen diffusion preventing film having the alumina film in the case of the related art described in the non-patent document 1. Therefore, the alumina film is small in etching selection ratio to platinum (Pt) corresponding to the first electrode upon etching for forming the opening in the alumina film. Thus, a process margin cannot be ensured unless, for example, etching conditions and in-plane uniformity are sufficiently optimal, or the thickness of the first electrode is thick sufficiently, thereby causing a risk that the first electrode is punched out with overetching of the alumina film. According to the semiconductor memory device of the first embodiment in this respect, there is little risk that since the etching selection ratio of platinum (Pt) corresponding to the first electrode 145 to $SiO_2$ corresponding to the insulating film 137 is taken sufficiently, even the first electrode is punched out with overetching upon forming the opening 131 by etching.

Thirdly, when the alumina film is used as the ferroelectric film as in the related art described in the non-patent document 1, a dedicated deposition device is newly required to form the alumina film, so that additional cost therefore is taken. The alumina deposition device is generally poor in throughput as compared with a CVD device and a sputter device normally used in a silicon semiconductor manufacturing process. According to the semiconductor memory device of the first embodiment in this respect, aluminum corresponding to the normal wiring material was used as the wiring film. Therefore, a dedicated deposition device for growing a hydrogen diffusion preventing film by a special material becomes unnecessary and no throughput is degraded.

[Manufacturing Method]

A method for manufacturing the semiconductor memory device according to the first embodiment of the present invention will next be explained using FIGS. 11 through 17. Incidentally, FIGS. 11 through 17 are cross-sectional views showing a section illustrated by FIG. 5.

[Step 1-1]

Figure 11:
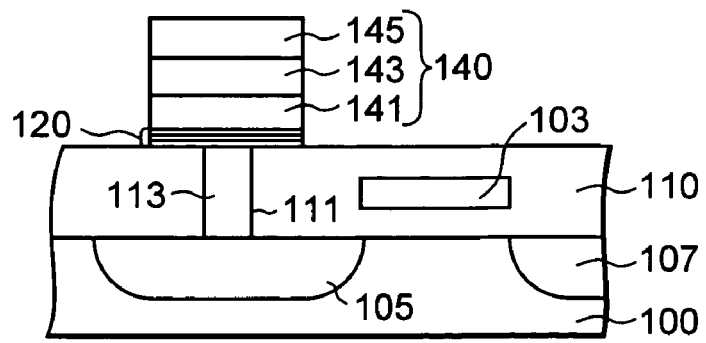
FIG. 11 is a cross-sectional view for describing a method for manufacturing the semiconductor memory device according to the first embodiment.

An interlayer insulating film 110 is formed on a semiconductor substrate 100 (see FIG. 11). Then, a contact hole 111 is opened or defined in the interlayer insulating film 110 lying on a source/drain region 105 of a access transistor formed in the semiconductor substrate 100, and a contact plug 113 is formed in its corresponding contact hole 111. Thus, one end of the contact plug 113 is electrically connected to the source/drain region 105 of the semiconductor substrate 100 (see FIG. 11). Next, a ferroelectric capacitor 140 is formed on the contact plug 113 (see FIG. 11). The ferroelectric capacitor 140 is formed by sequentially growing a second electrode 141, a ferroelectric film 143 and a first electrode 145. Consequently, the other end of the contact plug 113 and the second electrode 141 are electrically connected to each other. Here, polysilicon is used as the material for the contact plug 113, platinum (Pt) is used as the material for the second electrode 141, SBT is used as the material for the ferroelectric film 143, and platinum (Pt) is used as the material for the first electrode 145, respectively.

Further, preferably, an adhesive layer may be provided between the contact plug 113 and the second electrode 141. TiAlN, Ir and $IrO_2$ may be laminated from below as the adhesive layer 120.

Incidentally, tungsten may be used as the contact plug 113 and PZT may be used as the ferroelectric capacitor 140.

[Step 1-2]

Figure 12:
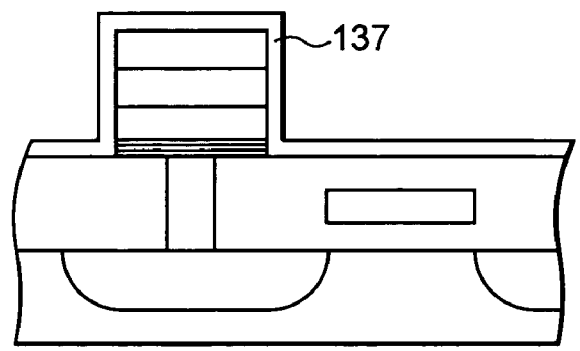
FIG. 12 is a cross-sectional view for describing the method for manufacturing the semiconductor memory device according to the first embodiment.
Figure 13:
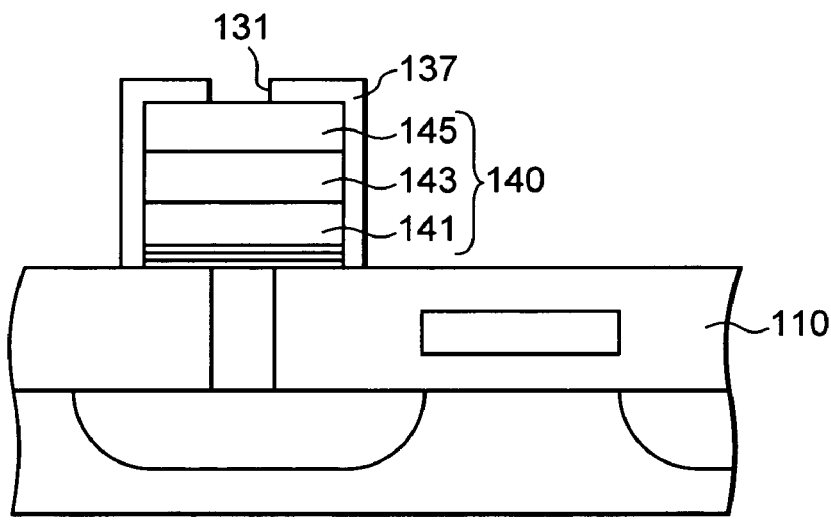
FIG. 13 is a cross-sectional view for describing the method for manufacturing the semiconductor memory device according to the first embodiment.

An insulating film 137 ($SiO_2$ film) is formed by a CVD method (see FIG. 12). An opening 131 that exposes the first electrode 145 of the ferroelectric capacitor 140 is defined or opened. Simultaneously, the insulating film 137 is removed by etching so as not to remain on the interlayer insulating film 110 except for areas among the ferroelectric capacitor 140 and other ferroelectric capacitors collectively covered with a wiring film 161 (see FIGS. 13 and 3). Thus, the corresponding insulating film 137, which covers the ferroelectric capacitor 140 and has the opening 131 that exposes the first electrode 145 is formed (see FIG. 13).

Incidentally, the $SiO_2$ film 137 is formed by an atmospheric-pressure thermal CVD method using ozone ($O_3$) good in flow shape and TEOS (Tetra Ethyl Ortho Silicate). Consequently, the temperature at a film forming process step can be set to a low temperature of about 400° C., and hydrogen is little generated either. Therefore, the ferroelectric film 143 is no damaged.

Also the insulating film 137 may be a conformally-coated one but may be thin.

[Step 1-3]

Figure 14:
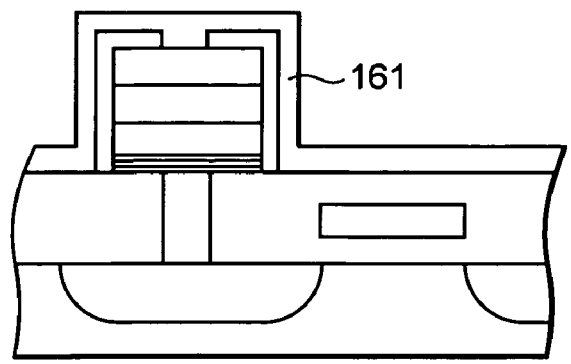
FIG. 14 is a cross-sectional view for describing the method for manufacturing the semiconductor memory device according to the first embodiment.
Figure 15:
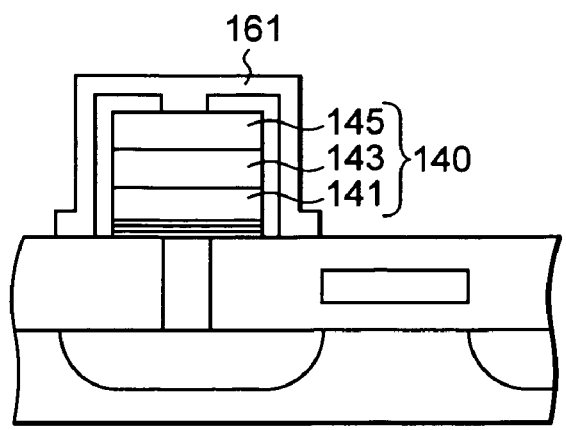
FIG. 15 is a cross-sectional view for describing the method for manufacturing the semiconductor memory device according to the first embodiment.
Figure 16:
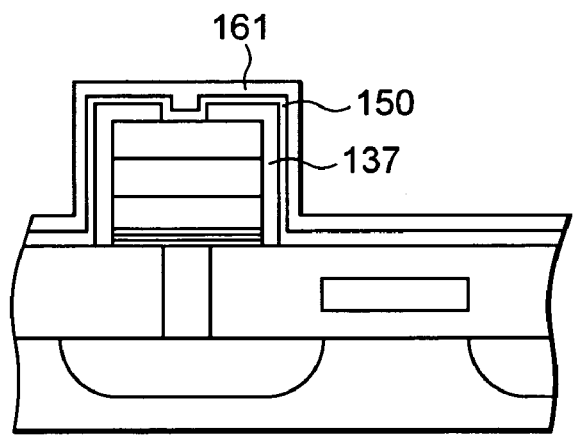
FIG. 16 is a cross-sectional view for describing the method shown in FIG. 11, at the time that a barrier layer 150 is provided between an insulating film 137 and a wiring film 161.
Figure 17:
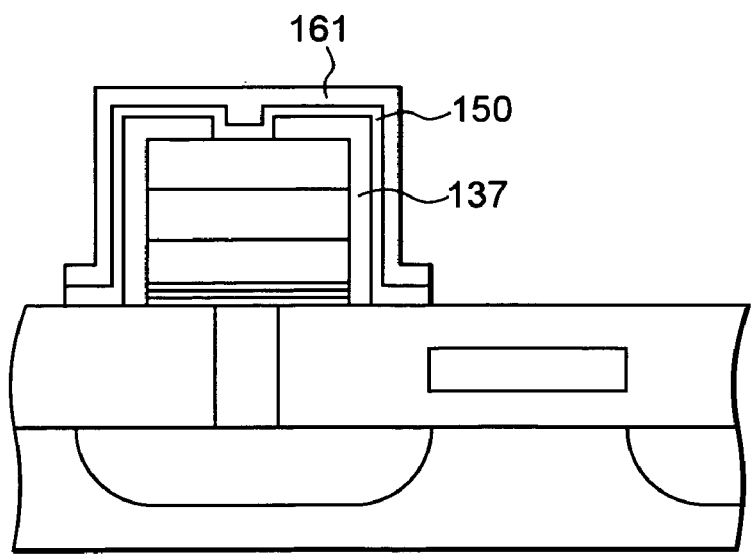
FIG. 17 is a cross-sectional view for describing the method shown in FIG. 11, at the time that the barrier layer 150 is provided between the insulating film 137 and the wiring film 161.

A wiring film 161 (aluminum) is formed by sputter (see FIG. 14). The ferroelectric capacitor 140 and the insulating film 137 are covered with the wiring film 161 by photolithography and etching (see FIGS. 15 and 3). Thus, the wiring film 161 is electrically connected to the first electrode 145 exposed through the opening 131. Incidentally, the wiring film 161 may collectively cover one or more other ferroelectric capacitors other than the illustrated ferroelectric capacitor 140 depending upon desired wiring patterns. Alternatively, the wiring film 161 may be extended as it is without covering other ferroelectric capacitors to form each wiring pattern. Further, a contact plug may be provided at an arbitrary portion on the wiring film 161 so as to be electrically connected to an upper wiring layer.

A barrier layer 150 may be provided between the insulating film 137 and the wiring film 161. That is, the barrier layer 150 is formed by sputter before the formation of the wiring film 161, and the wiring film 161 is formed continuously (see FIG. 16). The wiring film 161 and the barrier layer 150 can be patterned simultaneously by photolithography and etching (see FIG. 17).

Incidentally, titanium nitride is used as the barrier film 150. Although even pure aluminum may be used as the material for the wiring film 161, aluminum may preferably be formed as a principal component to such a degree that it can be used in the normal wiring.

Although aluminum for the wiring film 161 may be formed by a DC sputter method, it is preferably formed by a method good in coverage, like an ECR sputter.

Second Preferred Embodiment

A semiconductor memory device according to a second embodiment of the present invention and its manufacturing method will be explained using FIGS. 18 through 22. Incidentally, FIGS. 18 through 22 show cross-sectional, plan or perspective views of the semiconductor memory device according to the second embodiment.

[Structure]

Figure 18:
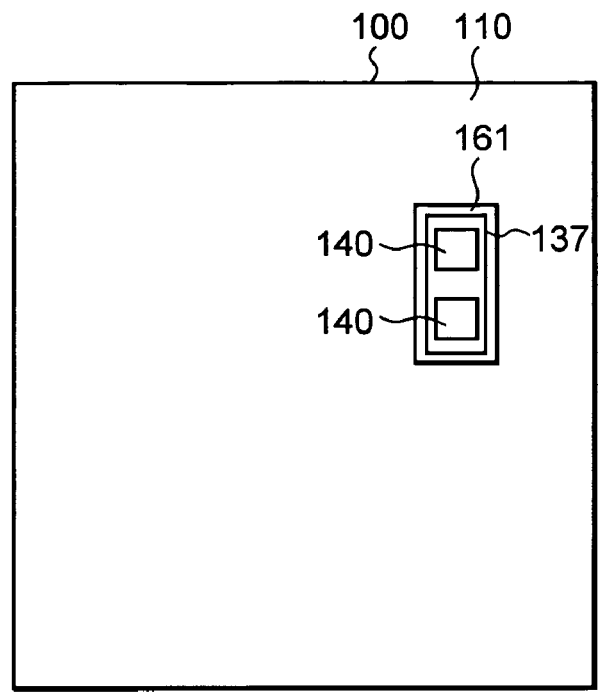
FIG. 18 is a plan view showing a semiconductor memory device according to a second embodiment.

FIG. 18 is a plan view showing a state in which a plurality of ferroelectric capacitors 140 formed on an interlayer insulating film 110 provided on a semiconductor substrate 100, and an insulating film 137 that covers them are collectively covered by a wiring film 161. Incidentally, the term "plural" in the present specification means "two or more", and two ferroelectric capacitors are formed in the second embodiment. The plural ferroelectric capacitors may be disposed in any position ever so many. The wiring film 161 is capable of collectively covering the arbitrary plural ferroelectric capacitors 140 in accordance with arbitrary wiring patterns necessary for the semiconductor memory device.

Figure 19:
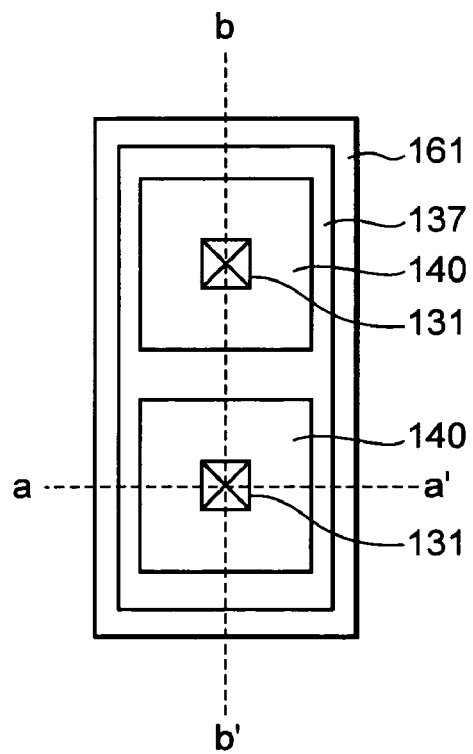
FIG. 19 is an enlarged view of FIG. 18.

FIG. 19 is an enlarged view showing a state in which the wiring film 161 shown in FIG. 18 has collectively covered the two ferroelectric capacitors 140 and the insulating film 137. Now, the wiring film 161 is electrically connected to its corresponding first electrodes 145 of the respective ferroelectric capacitors 140, which are exposed through openings 131, so that the first electrodes 145 of the two ferroelectric capacitors 140 are electrically connected to each other.

Figure 20:
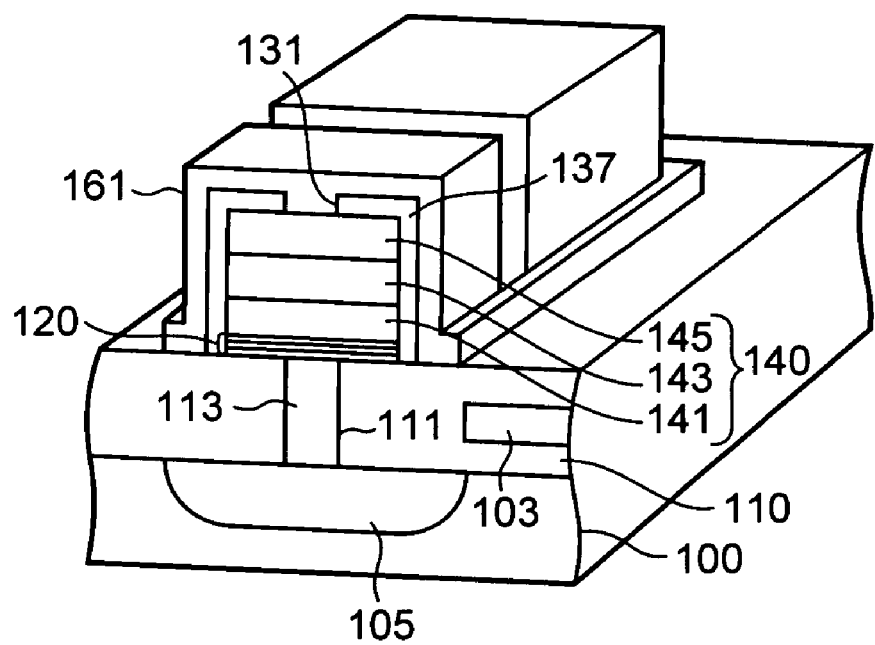
FIG. 20 is a perspective view including a cross-sectional view taken along line a-a' of FIG. 19.

The cross-sectional view taken along line a-a' of FIG. 19 is the same as FIG. 5, and FIG. 20 is a perspective view including the sectional view taken along a-a' of FIG. 19.

Figure 21:
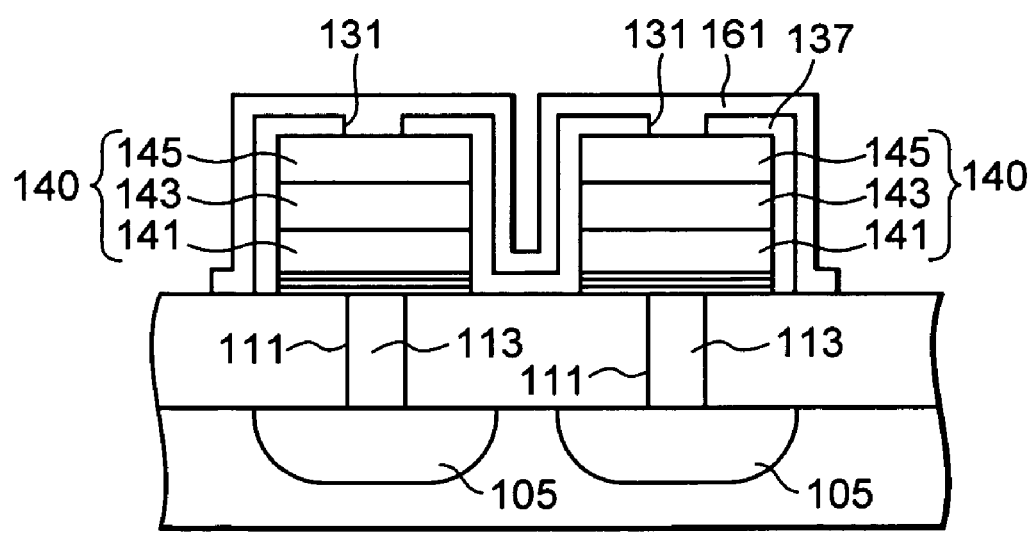
FIG. 21 is a cross-sectional view taken along line b-b' of FIG. 19.
Figure 22:
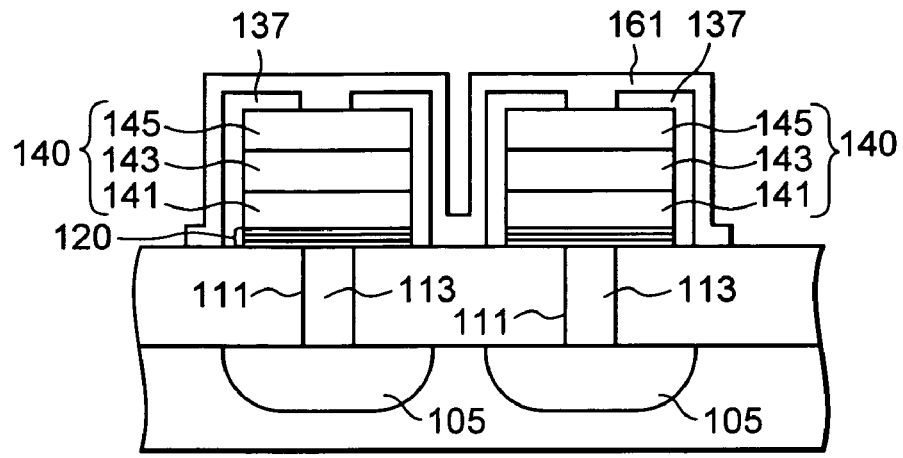
FIG. 22 is a cross-sectional view showing the manner in which an insulating film 137 is discontinuous between two ferroelectric capacitors.

FIG. 21 is a cross-sectional view taken along line b-b' of FIG. 19. The figure shows a state in which the wiring film 161 has collectively covered the two ferroelectric capacitors 140 and the insulating film 137. The wiring film 161 is electrically connected to its corresponding first electrodes 145 of the respective ferroelectric capacitors 140, which are exposed through the openings 131, so that the first electrodes 145 of the two ferroelectric capacitors 140 are electrically connected to each other. Incidentally, the insulating film 137 may collectively cover the two ferroelectric capacitors as shown in FIG. 21. Alternatively, the insulating film 137 may be discontinuous between two ferroelectric capacitors as shown in FIG. 22. Other various points are the same as the first embodiment.

[Manufacturing Method]

The method for manufacturing the semiconductor memory device according to the second embodiment of the present invention is basically the same as the method [Step 1-1] to [Step 1-3] for manufacturing the semiconductor memory device according to the first embodiment but different therefrom in that in [Step 1-3], the wiring film 161 collectively covers the plural ferroelectric capacitors 140 and the insulating film 137 and is electrically connected to the first electrodes 145 of the respective ferroelectric capacitors 140, which are exposed through the openings 131 to thereby electrically connect the first electrodes 145 of the two ferroelectric capacitors 140 to each other. As a result formed in this way, the semiconductor memory device is brought to such a structure as shown in FIG. 19 and FIGS. 21 or 22. Further, the plurality of ferroelectric capacitors 140 covered by the wiring film 161 may be disposed in any position ever so many. The wiring film 161 is capable of collectively covering arbitrary ferroelectric capacitors 140, depending upon arbitrary wiring patterns necessary for the semiconductor memory device. Other various points are the same as the first embodiment.

Third Preferred Embodiment

A semiconductor memory device according to a third embodiment of the present invention and its manufacturing method will be explained using FIGS. 23 through 26.

[Structure]

Figure 23:
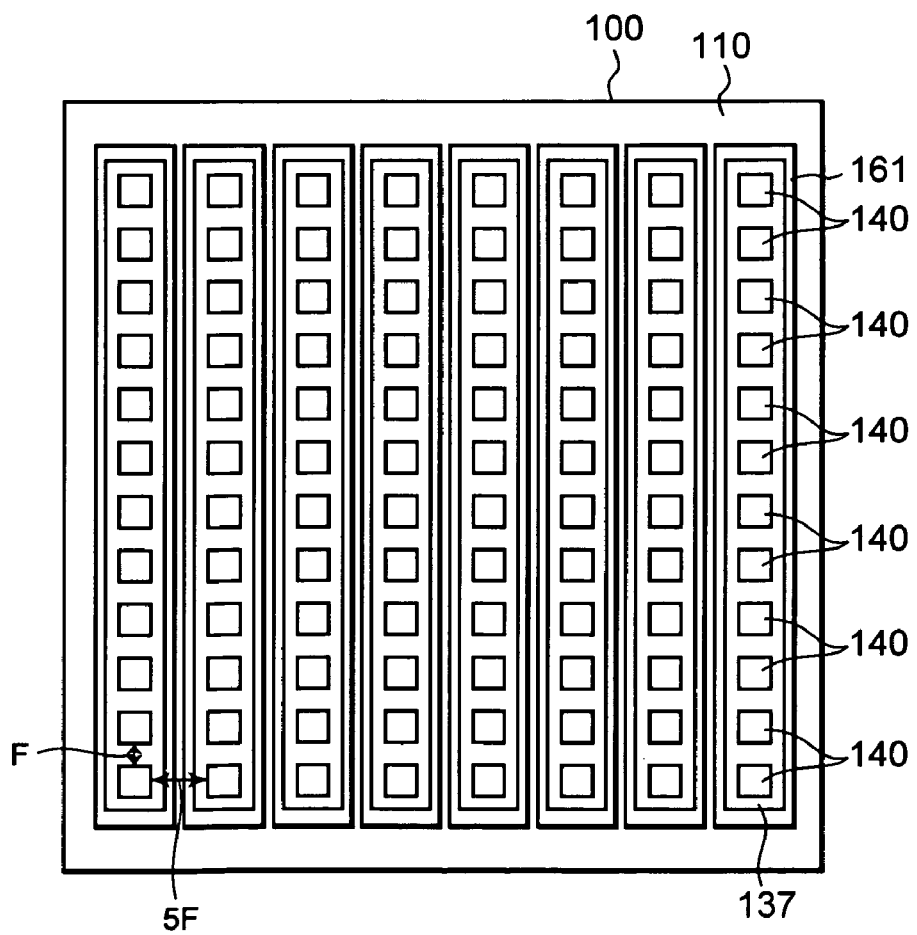
FIG. 23 is a plan view illustrating a semiconductor memory device according to a third embodiment.

FIG. 23 is a plan view showing a state in which a plurality of ferroelectric capacitors 140 arranged along row and column directions over an interlayer insulating film 110 provided on a semiconductor substrate 100, and insulating films 137 that cover them are collectively covered by wiring films 161 every respective columns.

Here, the ferroelectric capacitors 140 contained in the same column are respectively disposed with being spaced away from one another by a minimum design dimension (F). The ferroelectric capacitors 140 contained in the different columns are respectively disposed with being spaced away from one another by five times the minimum design dimension (F).

Figure 24:
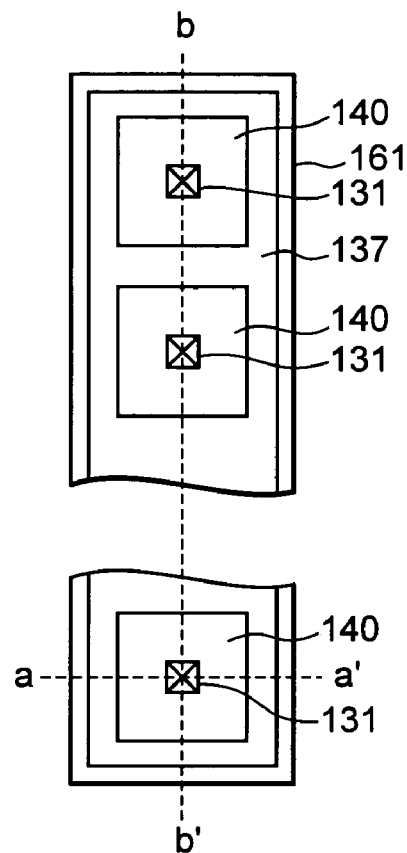
FIG. 24 is an enlarged view of FIG. 23.

FIG. 24 is an enlarged view showing one given column shown in FIG. 23 in an extracted form. The wiring film 161 collectively covers the plurality of ferroelectric capacitors 140 and the insulating film 137 that covers them, and is electrically connected to its corresponding first electrodes 145 of the respective ferroelectric capacitors 140, which are exposed through their corresponding openings 131, whereby the first electrodes 145 of the plural ferroelectric capacitors 140 are electrically connected to one another.

Figure 25:
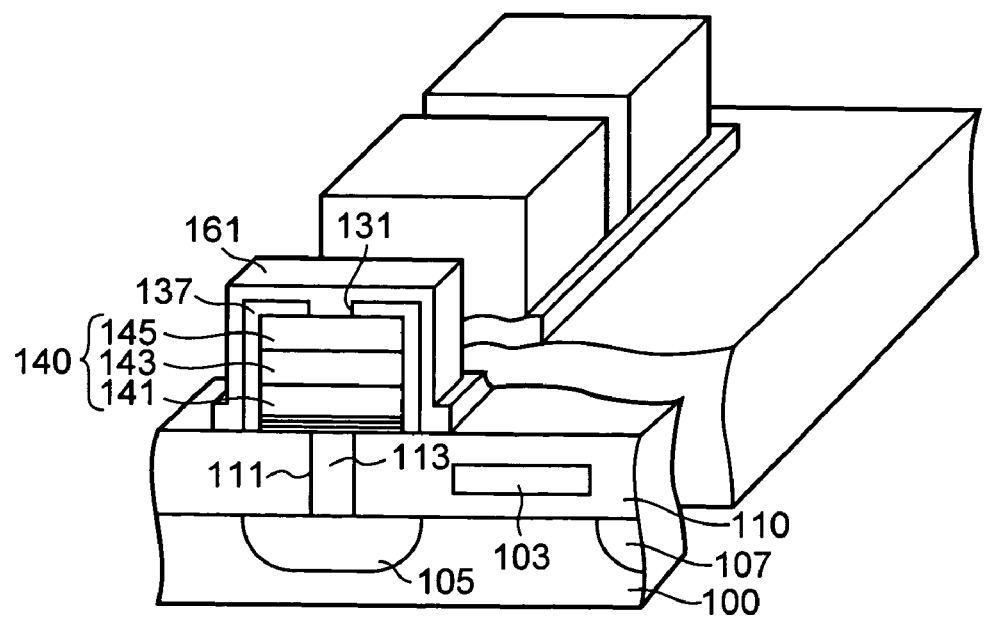
FIG. 25 is a perspective view including a cross-sectional view taken along line a-a' of FIG. 24.
Figure 26:
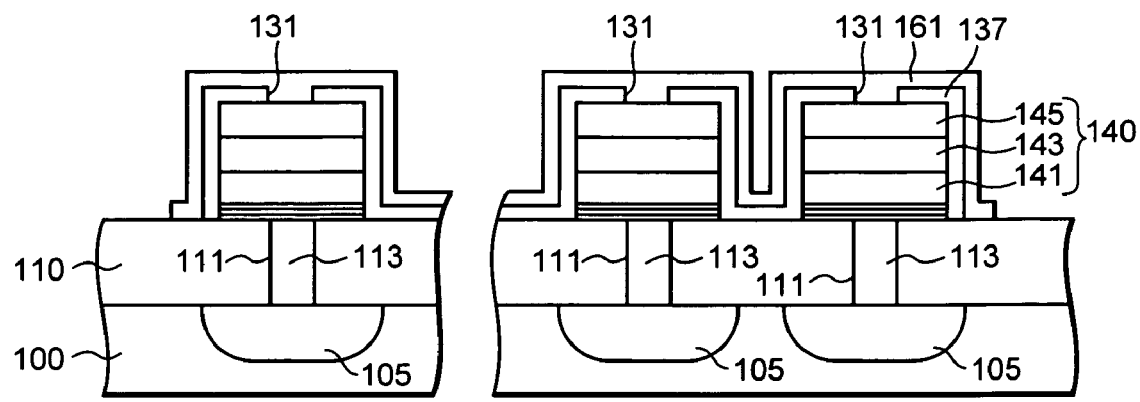
FIG. 26 is a cross-sectional view taken along line b-b' of FIG. 19.

FIG. 25 is a perspective view including a cross-sectional view taken along line a-a' of FIG. 24, and FIG. 26 is a cross-sectional view taken along line b-b' of FIG. 24, respectively. The cross-sectional view taken along line a-a' of FIG. 24 is the same as FIG. 5.

The semiconductor memory device according to the third embodiment is basically the same in structure as the semiconductor memory device according to the first embodiment but different therefrom in that the plurality of ferroelectric capacitors 140 are arranged over the interlayer insulating film 110 along the row and column directions (see FIG. 23). The semiconductor memory device according to the third embodiment is different therefrom even in that the wiring films 161 collectively cover the plurality of ferroelectric capacitors 140 and the insulating films 137 every respective columns respectively and are electrically connected to their corresponding first electrodes 145 of the respective ferroelectric capacitors 140, which are exposed through the openings 131 to thereby electrically connect the first electrodes 145 of the plurality of ferroelectric capacitors 140 to one another every respective columns (see FIG. 23). Each of the wiring films 161 can serve as a common plate line for the plurality of ferroelectric capacitors corresponding to one column. Incidentally, the wiring film needs not to cover all of the plural ferroelectric capacitors constituting each column. It is enough if the wiring films cover the ferroelectric capacitors necessary for the functions of the semiconductor memory device. The term "every respective columns" in the present specification is no more than meaning of such an extent that each column corresponds to any of directions associated with the plurality of ferroelectric capacitors arranged in an array form. Thus, any direction may be taken as the column direction.

With such a structure that the wiring films 161 cover the ferroelectric capacitors and the insulating films every respective columns on a regular basis in this way, there is a need to dispose the ferroelectric capacitors 140 contained in the different columns with being spaced (e.g., 5F) away from one another in such a way that the distance between the adjacent ferroelectric capacitors 140 is wider than the minimum design dimension (F). However, the ferroelectric capacitors 140 contained in the same column may be disposed with being spaced away from one another by at least the minimum design dimension (F).

Other various points are the same as the first embodiment.

[Manufacturing Method]

The method for manufacturing the semiconductor memory device according to the third embodiment of the present invention is basically the same as the method [Step 1-1] to [Step 1-3] for manufacturing the semiconductor memory device according to the first embodiment.

However, the present method is different therefrom in that in [Step 1-1], a plurality of contact plugs 113 are first formed in the interlayer insulating film 110 and the plurality of ferroelectric capacitors 140 are arranged on the contact plugs 113 along the row and column directions. Incidentally, even though there is a need to dispose the ferroelectric capacitors 140 contained in the different columns with being spaced (e.g., 5F) away from one another in such a way that the distance between the adjacent ferroelectric capacitors 140 is wider than the minimum design dimension (F), the ferroelectric capacitors 140 contained in the same column may be disposed with being spaced away from one another by at least the minimum design dimension (F) (see FIG. 23).

Further, the present method is different from the first embodiment in that in [Step 1-3], the wiring film 161 collectively covers the plurality of ferroelectric capacitors 140 and the insulating film 137 for each column and is electrically connected to the first electrodes 145 of the respective ferroelectric capacitors 140, which are exposed through the openings 131 thereby to electrically connect the first electrodes 145 of the plurality of ferroelectric capacitors 140 to one another for each column (see FIG. 24). As a result formed in this way, the semiconductor memory device is brought to such a structure as shown in FIGS. 24 through 26. Incidentally, the wiring film needs not to cover all of the plural ferroelectric capacitors constituting each column. It is enough if the wiring films cover the ferroelectric capacitors necessary for the functions of the semiconductor memory device. Each of the wiring films 161 can serve as a common plate line for the plurality of ferroelectric capacitors 140 corresponding to one column.

Other various points are the same as the first embodiment.

Fourth Preferred Embodiment

A semiconductor memory device according to a fourth embodiment of the present invention will be explained using FIGS. 27 through 35. Incidentally, FIGS. 27 through 30 respectively show cross-sectional, plan or perspective views of the semiconductor memory device according to the fourth embodiment, and FIGS. 31 through 35 respectively show sections taken every manufacturing process steps of the semiconductor memory device according to the fourth embodiment.

[Structure]

Figure 27:
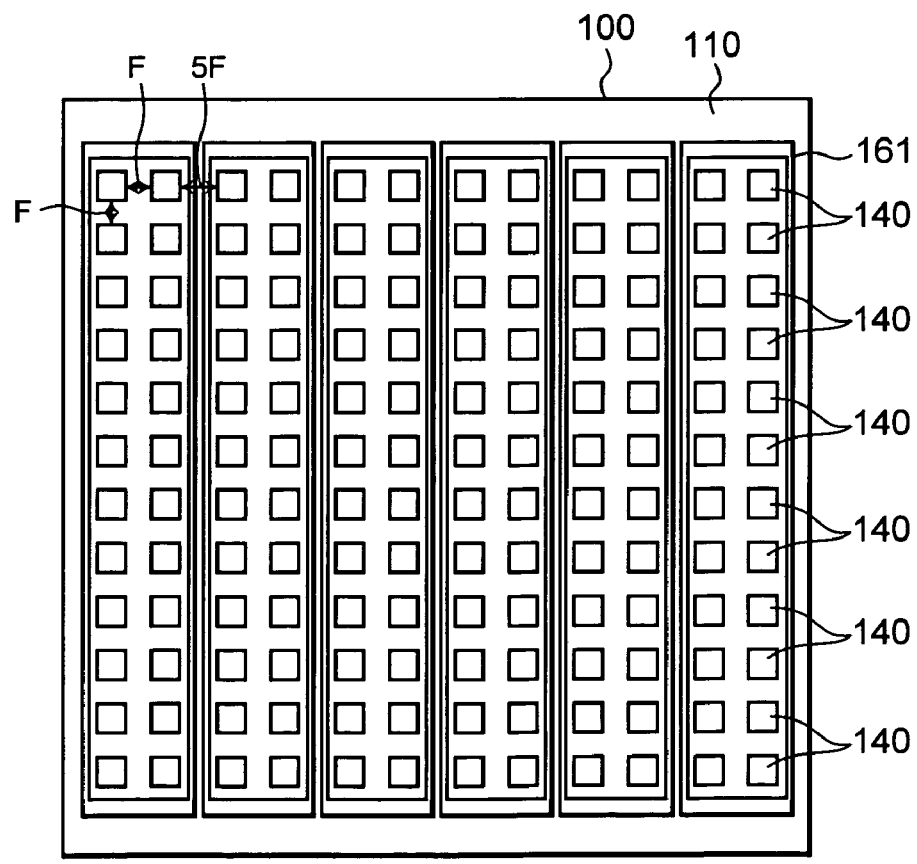
FIG. 27 is a plan view showing a semiconductor memory device according to a fourth embodiment.

FIG. 27 is a plan view showing a state in which a plurality of ferroelectric capacitors 140 arranged along row and column directions over an interlayer insulating film 110 provided on a semiconductor substrate 100, and insulating films 137 that cover them are collectively covered by wiring films 161 every plural columns. Incidentally, although the fourth embodiment shows an example in which they are covered every two columns, the number of columns may be three or more if plural columns are taken.

Although the ferroelectric capacitors 140 of the two columns collectively covered by the wiring film 161 may be disposed with being spaced away by at least a minimum design dimension (F), the packed or aggregated portions of the ferroelectric capacitors 140 collected by the wiring films 161 in this way need to be spaced (e.g., 5F) away from one another in such a way that the interval therebetween is wider than the minimum design dimension (F) (See FIG. 27).

Figure 28:
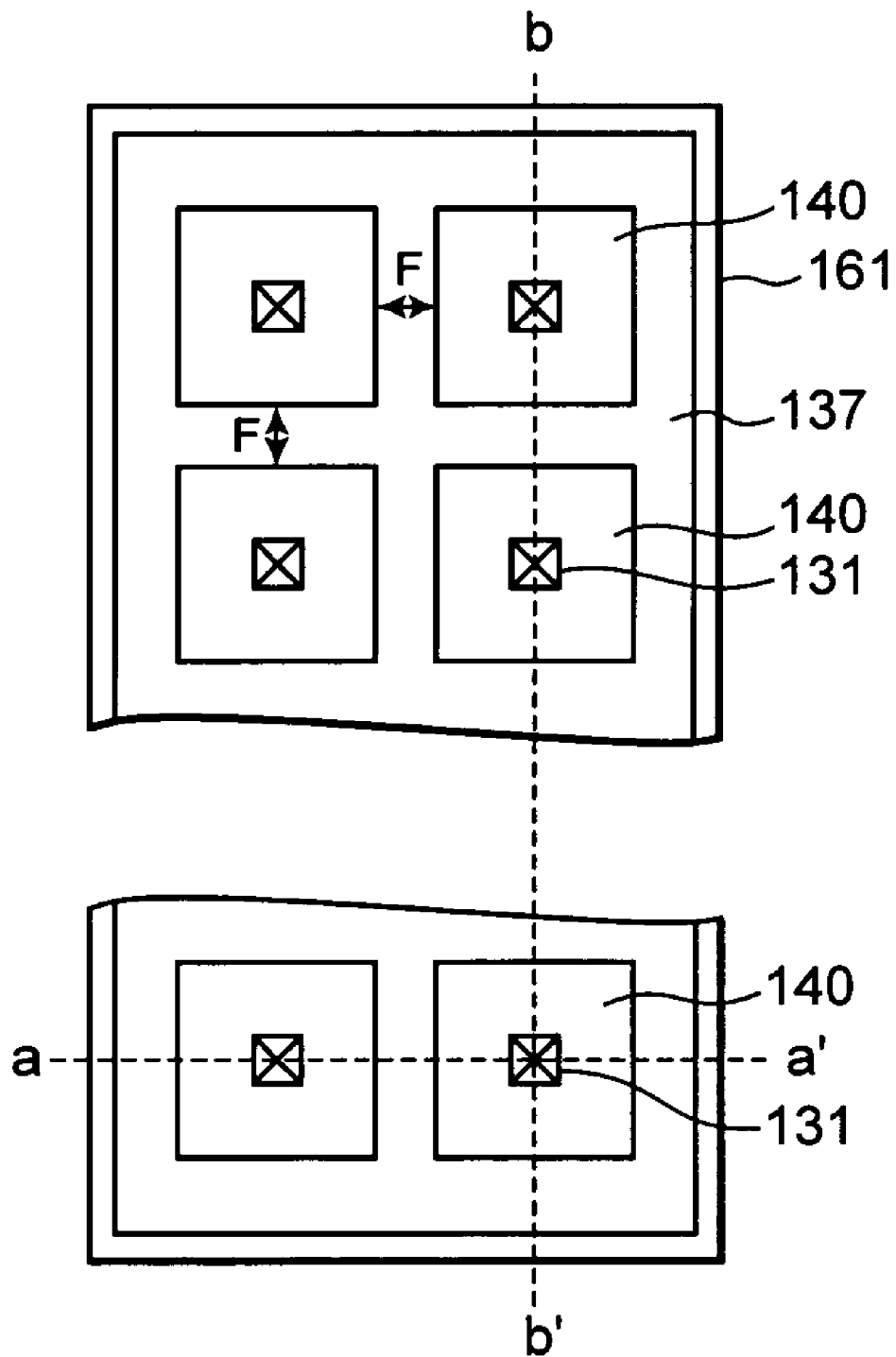
FIG. 28 is an enlarge view of FIG. 27.

FIG. 28 is an enlarged view showing, in an extracted form, the ferroelectric capacitors of the two columns shown in FIG. 27 and collectively covered with the wiring film 161. Each of the wiring films 161 collectively covers the plural ferroelectric capacitors 140 and the insulating film 137 every two columns and is electrically connected to its corresponding first electrodes 145 of the respective ferroelectric capacitors 140, which are exposed through their corresponding openings 131, whereby the first electrodes 145 of the plural ferroelectric capacitors 140 are respectively electrically connected to one another every two columns.

Figure 29:
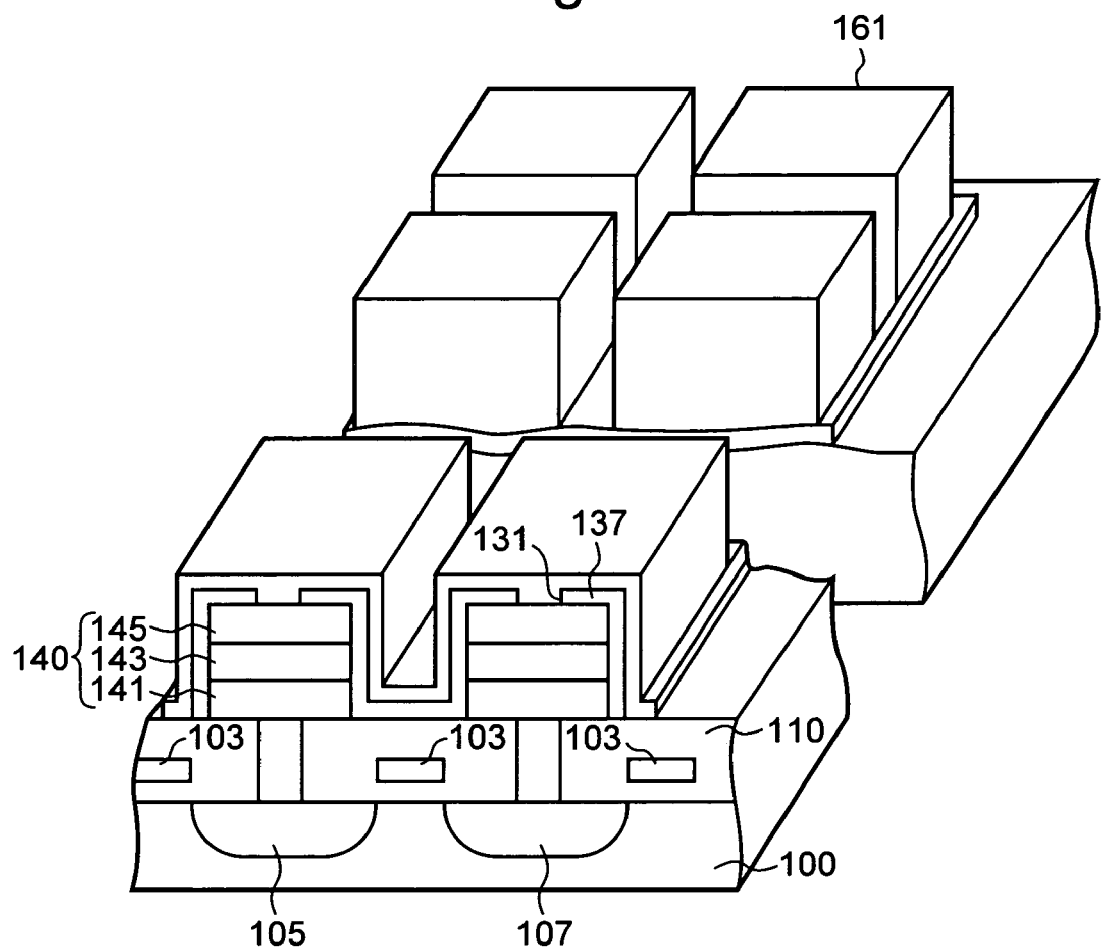
FIG. 29 is a perspective view including a cross-sectional view taken along line a-a' of FIG. 28.
Figure 30:
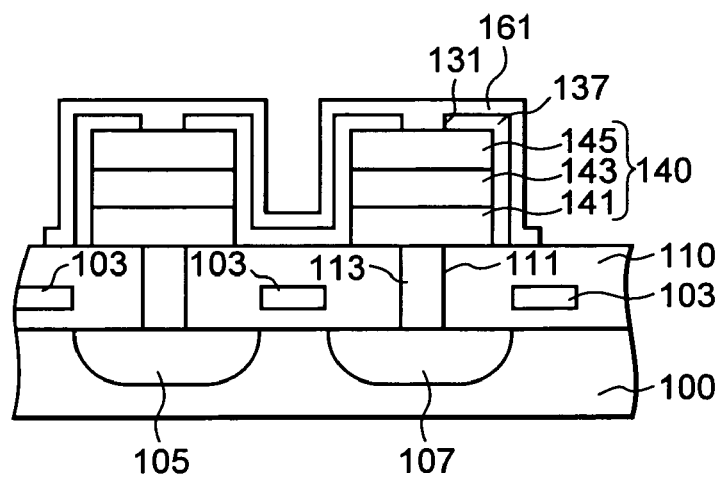
FIG. 30 is a cross-sectional view taken along line a-a' of FIG. 28.

FIG. 29 is a perspective view including a cross-sectional view taken along line a-a' of FIG. 28, and FIG. 30 is a cross-sectional view taken along a-a' of FIG. 28, respectively. A cross-sectional view taken along line b-b' of FIG. 28 is the same as FIG. 26.

The semiconductor memory device according to the fourth embodiment is basically the same in structure as the semiconductor memory device according to the first embodiment but different therefrom in that the plurality of ferroelectric capacitors 140 are arranged above the interlayer insulating film 110 along the row and column directions. The semiconductor memory device according to the fourth embodiment is different from the first embodiment even in that the wiring films 161 collectively cover the plurality of ferroelectric capacitors 140 and the insulating films 137 every two columns respectively and are electrically connected to their corresponding first electrodes 145 of the respective ferroelectric capacitors 140, which are exposed through the openings 131 to thereby electrically connect the first electrodes 145 of the plurality of ferroelectric capacitors 140 to one another every two columns. Incidentally, the wiring film needs not to cover all of the plural ferroelectric capacitors constituting the two columns. It is enough if the wiring films cover the ferroelectric capacitors necessary for the functions of the semiconductor memory device. Each of the wiring films 161 can serve as a common plate line for the plurality of ferroelectric capacitors of the two columns.

Owing to the provision of such a structure that the wiring films 161 cover the ferroelectric capacitors and the insulating films every two columns on a regular basis in this way, the fourth embodiment has an aspect advantageous over the third embodiment wherein the wiring films 161 cover the ferroelectric capacitors and the insulating films every columns. That is, there is an aspect that in the case of the structure of the third embodiment, the capacitors need to be disposed with being spaced (e.g., 5F) away from one another in such a manner that the interval between the adjacent columns is wider than the minimum design dimension (F), because the wiring films for covering the capacitors every columns need to be separated from one another, and that the present structure should be improved judging from the viewpoint that the coefficient of area utilization of a chip is caused to improve. According to the fourth embodiment in this respect, since the wiring films 161 cover the ferroelectric capacitors every adjacent two columns, the ferroelectric capacitors 140 of the two columns collectively covered by the wiring film 161 may be spaced away from each other by at least the minimum design dimension (F) in both row and column directions. Therefore, the present embodiment can be improved in the coefficient of area utilization of the chip as compared with the third embodiment (see FIG. 27).

Other various points are similar to the first embodiment.

[Manufacturing Method]

A method for manufacturing the semiconductor memory device according to the fourth embodiment of the present invention will next be described using FIGS. 31 through 35. Incidentally, FIGS. 31 through 35 are respectively cross-sectional views showing a section shown in FIG. 30.

[Step 4-1]

Figure 31:
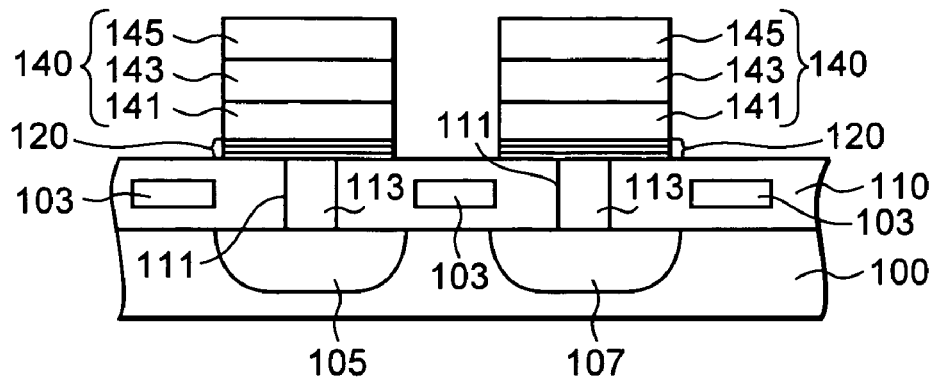
FIG. 31 is a cross-sectional view for describing a method for manufacturing the semiconductor memory device according to the fourth embodiment.

An interlayer insulating film 110 is formed on a semiconductor substrate 100 (see FIG. 31). Then, a plurality of contact holes 111 are opened or defined in the interlayer insulating film 110 lying on a source/drain region 105 of a access transistor formed in the semiconductor substrate 100.

A plurality of contact plugs 113 are respectively formed in the plurality of contact holes 111. Thus, each of one ends of the plural contact plugs 113 is electrically connected to the source/drain region 105 of the semiconductor substrate 100 (see FIG. 31). Next, a plurality of ferroelectric capacitors 140 are formed on the plural contact plugs 113 along the row and column directions (see FIG. 31). Thus, the other ends of the plural contact plugs 113 and second electrodes 141 of the plural ferroelectric capacitors 140 are electrically connected to one another. Incidentally, although the ferroelectric capacitors 140 of the two columns collectively covered by wiring films 161 to be described later may be disposed away from one another by at least a minimum design dimension (F), the aggregated portions of the ferroelectric capacitors 140 collected by the wiring films 161 in this way need to be disposed with being spaced (e.g., 5F) away from one another in such a way that the interval therebetween is wider than the minimum design dimension (F) (See FIG. 27). Although the fourth embodiment has shown an example in which the ferroelectric capacitors are covered every two columns, the number of columns may be three or more if plural columns are taken.

Further, preferably, an adhesive layer 120 may be provided between each contact plug 113 and its corresponding second electrode 141. TiAlN, Ir and IrO$_2$ may be laminated from below as the adhesive layer 120.

[Step 4-2]

Figure 32:
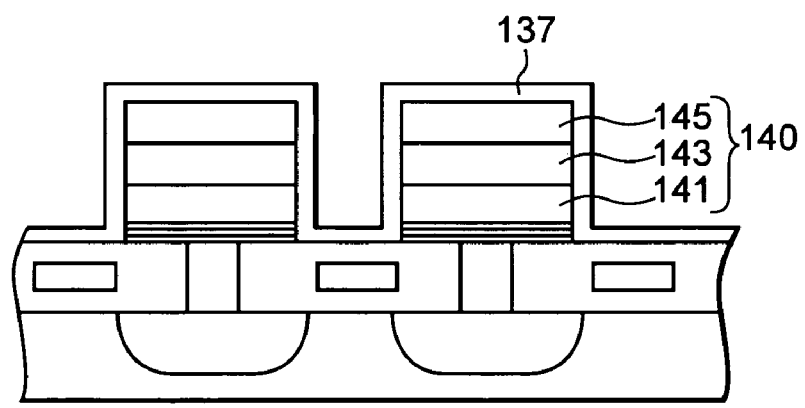
FIG. 32 is a cross-sectional view for describing the method for manufacturing the semiconductor memory device according to the fourth embodiment.
Figure 33:
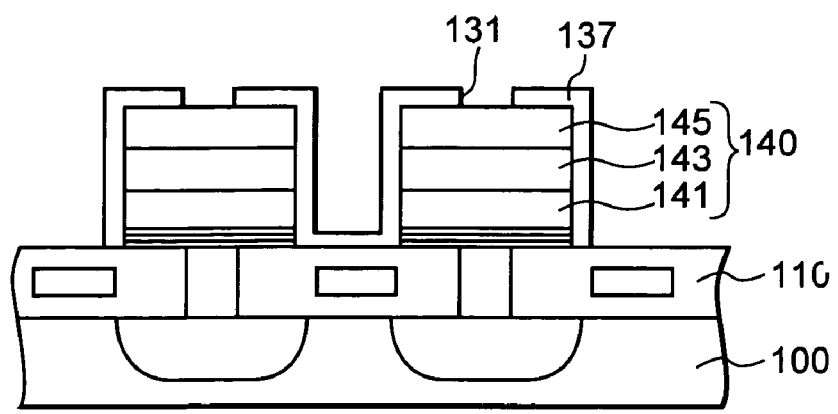
FIG. 33 is a cross-sectional view for describing the method for manufacturing the semiconductor memory device according to the fourth embodiment.
Figure 34:
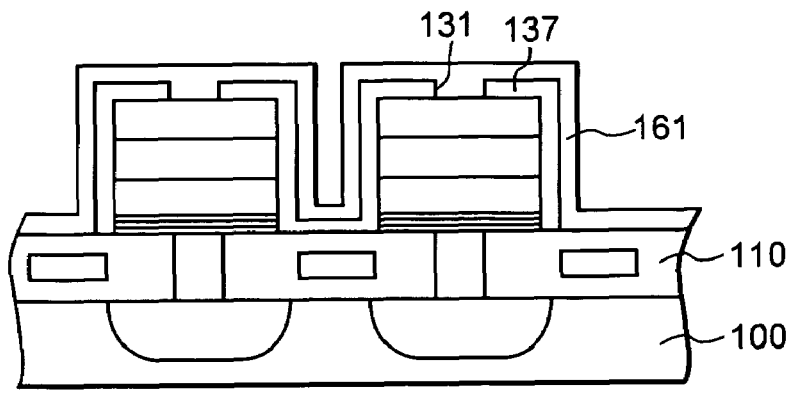
FIG. 34 is a cross-sectional view for describing the method for manufacturing the semiconductor memory device according to the fourth embodiment.
Figure 35:
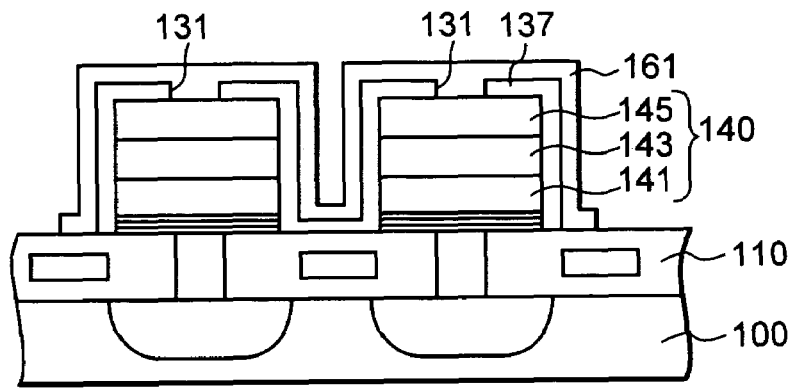
FIG. 35 is a cross-sectional view for describing the method for manufacturing the semiconductor memory device according to the fourth embodiment.

An insulating film 137 (SiO$_2$ film) is formed by a CVD method (see FIG. 32). Openings 131 that expose the first electrodes 145 of the ferroelectric capacitors 140 are defined or opened. Simultaneously, the insulating film 137 is removed by etching so as not to remain on the interlayer insulating film 110 except for areas among the ferroelectric capacitors 140 and other ferroelectric capacitors 140 collectively covered with the wiring film 161 (see FIGS. 33 and 28).

[Step 4-3]

A wiring film 161 (aluminum) is formed by sputter (see FIG. 34) and the wiring film 161 collectively cover the plural ferroelectric capacitors 140 and the insulating film 137 every two columns by photolithography and etching and is electrically connected to its corresponding first electrodes 145 of the respective ferroelectric capacitors 140, which are exposed through the openings 131 thereby. Therefore, the present embodiment is different from the first embodiment in that the first electrodes 145 of the plurality of ferroelectric capacitors 140 are electrically connected to one another every two columns (see FIGS. 35 and 28). Incidentally, the wiring film needs not to cover all of the plural ferroelectric capacitors constituting the two columns. It is enough if the wiring film covers the ferroelectric capacitors necessary for the functions of the semiconductor memory device. The wiring film 161 serves as a common plate line for each capacitor block comprising the ferroelectric capacitors 140 of two columns.

Others, film's materials, a method of forming each opening, etc. are the same as those employed in the first embodiment, and diversified modifications are considered.

(Experimental Data)

Experimental data related to the present invention will be explained below.

Figure 36:
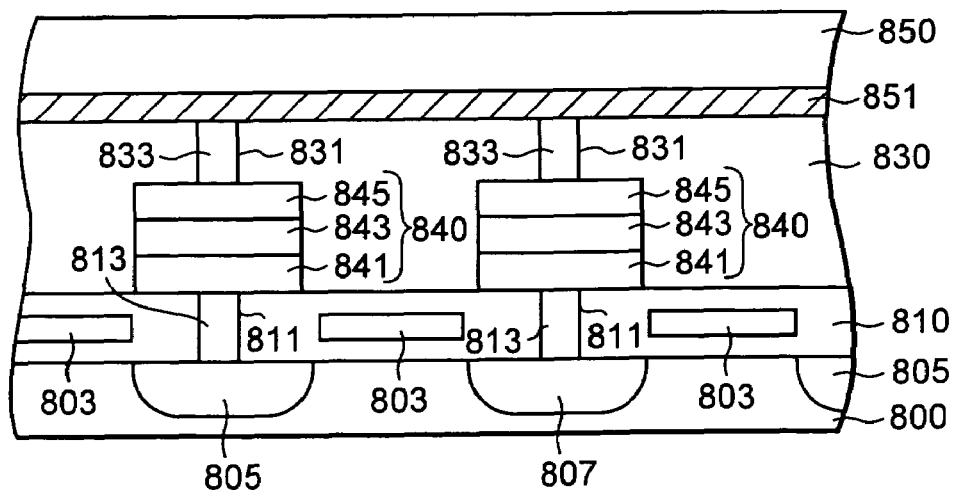
FIG. 36 is a cross-sectional view showing ferroelectric capacitors and a first metal wiring layer disposed thereabove both of which are used in an experiment.
Figure 37:
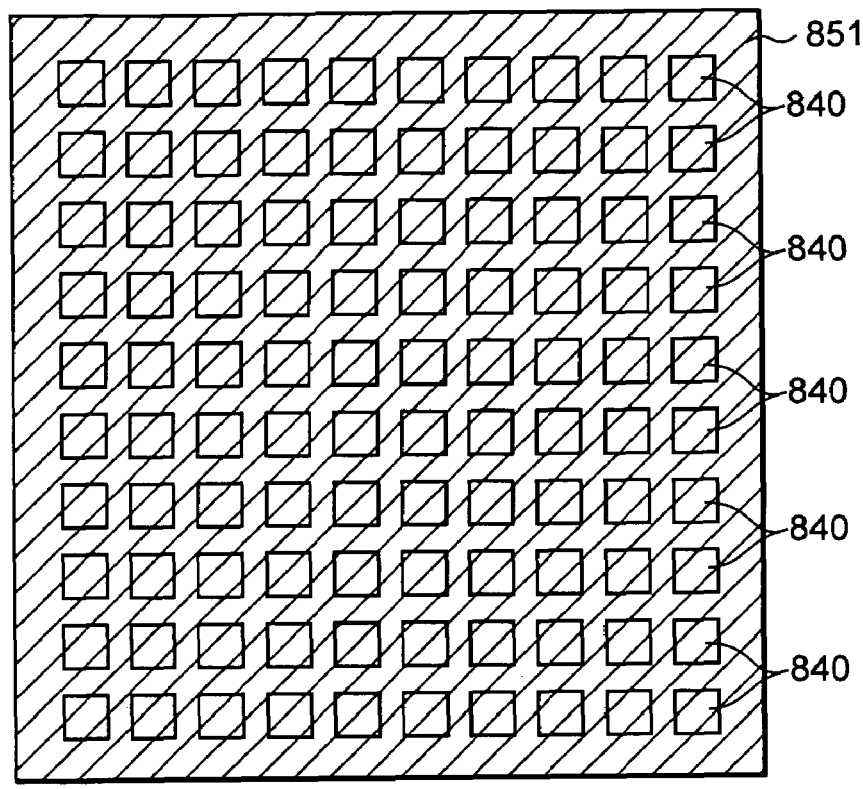
FIG. 37 is a plan view illustrating ferroelectric capacitors and a first metal wiring layer disposed thereabove both of which are used in an experiment.
Figure 38:
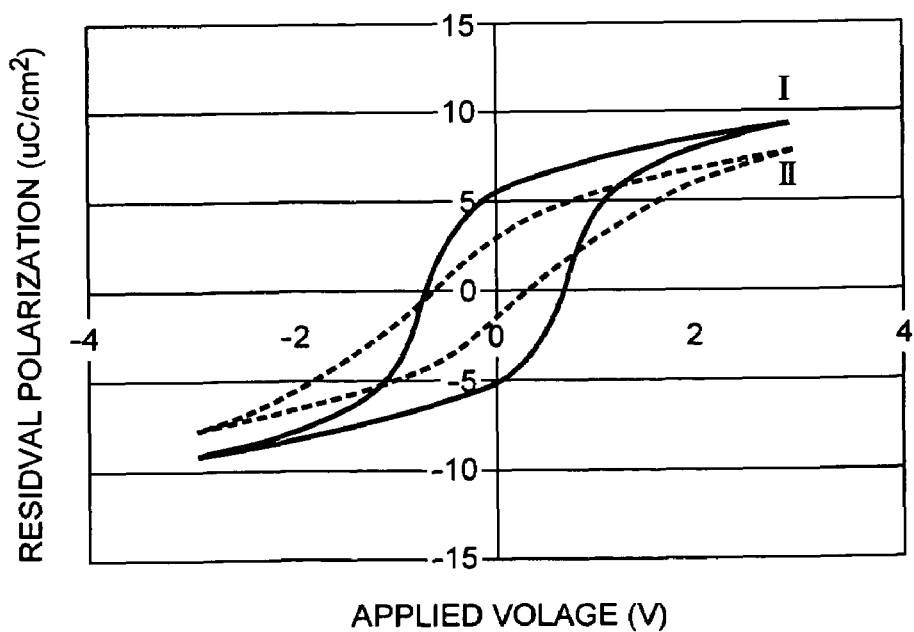
FIG. 38 is a graph depicting an experimental result.
Figure 39:
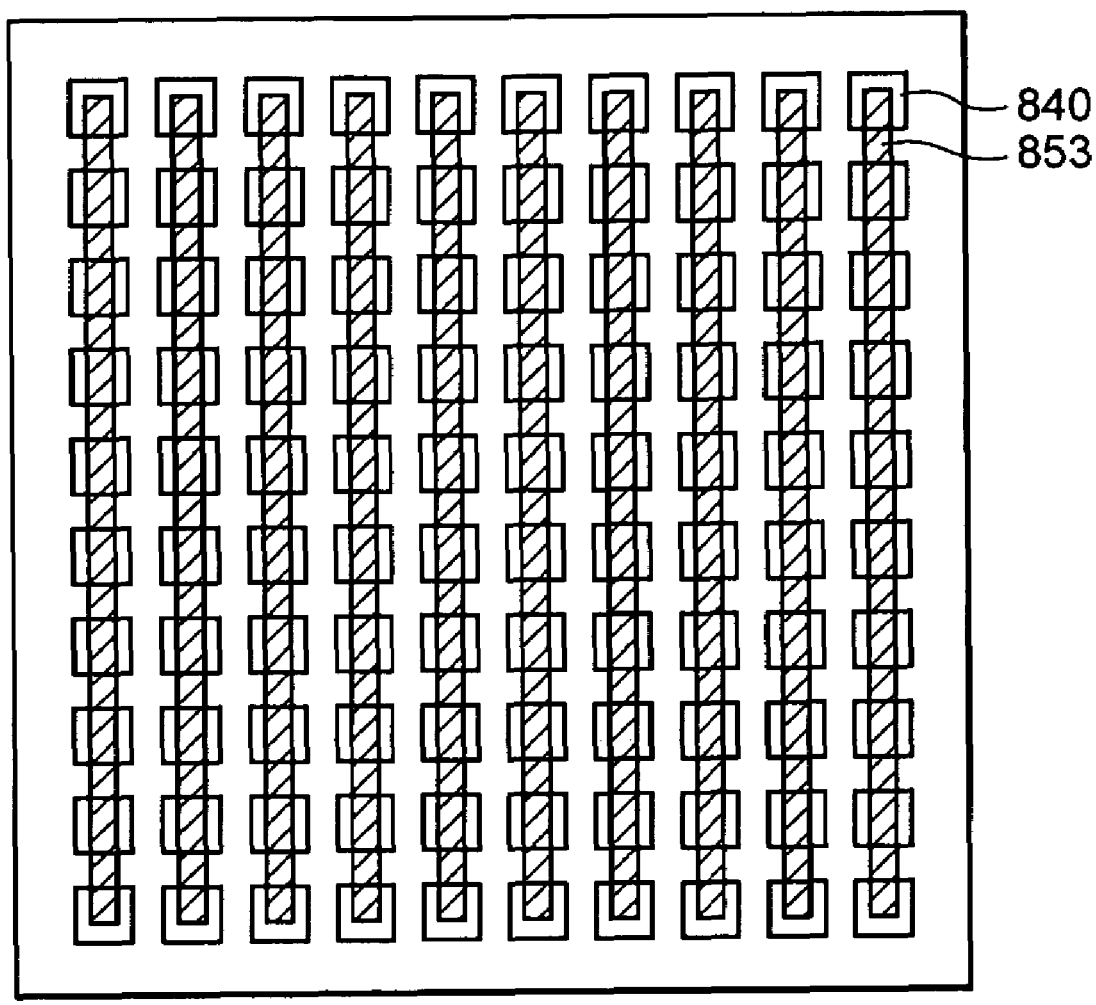
FIG. 39 is a plan view showing normal first metal wiring layers.

Experimental conditions for the data will be described with reference to FIGS. 36 and 37. FIG. 36 is a cross-sectional view showing ferroelectric capacitors 840 and a first metal wiring layer 851 located thereabove both of which are used in the present experiment. A first electrode 845 of each ferroelectric capacitor 840 is connected to the first metal wiring layer 851 made up of an aluminum silicon copper alloy located above a contact plug 833 by means of the contact plug 833. In the present experiment, the first metal wiring layer 851 was formed so as to cover the full face of an insulating film 830 as shown in FIG. 37. Thereafter, polarization-electric field characteristics of each ferroelectric capacitor 840 were measured via the normal backend process (corresponding to the process of fabricating wirings for mutually connecting elements such as a transistor, etc., or a wiring structure for power or ground). The result of measurements thereof is given by a graph indicated by | of FIG. 38. On the other hand, a graph indicated by ∥ of FIG. 38 shows polarization-electric field characteristics where such first metal wiring layers 853 shown in FIG. 39 each having a normal width narrower than an outer dimension of each capacitor are formed and thereafter subjected to the normal backend process. It can be read from a comparison between the graphs a and b that ferroelectric capacitors are covered with a film comprised of an aluminum silicon copper alloy with an insulating film interposed therebetween, so that the diffusion of hydrogen into the ferroelectric capacitors in the backend process is prevented and hence degradation of ferroelectric characteristics is prevented. Similarly in doing so, it is estimated that even in the case of the first through fourth embodiments of the present invention, each of which adopts such a structure that the ferroelectric capacitors are covered with the film made up of aluminum with the insulating film interposed therebetween, the diffusion of hydrogen into the ferroelectric capacitors in the backend process is prevented and hence degradation of ferroelectric characteristics is prevented.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory device comprising:
    an interlayer insulating film formed on a semiconductor substrate;
    a contact plug formed in the interlayer insulating film and having one end electrically connected to the semiconductor substrate;
    a ferroelectric capacitor formed on the interlayer insulating film and comprising a first electrode, a ferroelectric film and a second electrode electrically connected to an other end of the contact plug;
    an insulating film which covers the ferroelectric capacitor and has an opening that exposes the first electrode; and
    a wiring film which covers the insulating film and conformally covers a top surface and all side surfaces of the ferroelectric capacitor, and is electrically connected to the first electrode exposed through the opening, said wiring film consisting of a material having conductivity and a hydrogen diffusion preventing function.

2. The semiconductor memory device according to claim 1, wherein the wiring film consists of aluminum or a material with aluminum as a principal component.

3. The semiconductor memory device according to claim 1, wherein the wiring film is used as a plate line.

4. The semiconductor memory device according to claim 1, wherein a barrier layer is provided between the first electrode and the wiring film.

5. A semiconductor memory device comprising:
an interlayer insulating film formed on a semiconductor substrate;
a plurality of contact plugs formed in the interlayer insulating film and having first ends electrically connected to the semiconductor substrate;
a plurality of ferroelectric capacitors formed on the interlayer insulating film, said ferroelectric capacitors each comprising a first electrode, a ferroelectric film, and a second electrode respectively electrically connected to an other end of a respective one of said contact plugs;
an insulating film which covers the plurality of ferroelectric capacitors and has openings that expose the first electrodes; and
a wiring film which covers the insulating film and conformally covers top surfaces and all side surfaces of the ferroelectric capacitors, and electrically connects the first electrodes exposed through the openings to one another, said wiring film consisting of a material having conductivity and a hydrogen diffusion preventing function.

6. The semiconductor memory device according to claim 5, wherein the wiring film consists of aluminum or a material with aluminum as a principal component.

7. The semiconductor memory device according to claim 5, wherein the wiring film is used as a plate line.

8. The semiconductor memory device according to claim 5, wherein a barrier layer is provided between each of the first electrodes and the wiring film.

9. A semiconductor memory device comprising:
an interlayer insulating film formed on a semiconductor substrate;
a plurality of contact plugs formed in the interlayer insulating film and having first ends electrically connected to the semiconductor substrate;
a plurality of ferroelectric capacitors formed on the interlayer insulating film, said ferroelectric capacitors each comprising a first electrode, a ferroelectric film, and a second electrode electrically connected to an other end of a respective one of said contact plugs, said ferroelectric capacitors being arranged on the interlayer insulating film along row and column directions;
insulating films which respectively cover the plurality of ferroelectric capacitors in respective columns and have openings that expose the first electrodes; and
wiring films which respectively cover the insulating films in the respective columns and respectively conformally cover top surfaces and all side surfaces of the ferroelectric capacitors in the respective columns, and electrically connect the first electrodes exposed through the openings to one another in the respective columns, said wiring films consisting of a material having conductivity and a hydrogen diffusion preventing function.

10. The semiconductor memory device according to claim 9, wherein the wiring films consist of aluminum or a material with aluminum as a principal component.

11. The semiconductor memory device according to claim 9, wherein the wiring films are used as plate lines.

12. The semiconductor memory device according to claim 9, wherein a barrier layer is provided between each of the first electrodes and the wiring films.

13. A semiconductor memory device comprising:
an interlayer insulating film formed on a semiconductor substrate;
a plurality of contact plugs formed in the interlayer insulating film and having first ends electrically connected to the semiconductor substrate;
a plurality of ferroelectric capacitors formed on the interlayer insulating film, said ferroelectric capacitors each comprising a first electrode, a ferroelectric film, and a second electrode electrically connected to an other end of a respective one of said contact plugs, said ferroelectric capacitors being arranged on the interlayer insulating film along row and column directions;
insulating films which respectively cover the plurality of ferroelectric capacitors of respective grouped plural columns and have openings that expose the first electrodes; and
wiring films which respectively cover the insulating films of the respective grouped plural columns and respectively conformally cover top surfaces and all side surfaces of the ferroelectric capacitors of the respective grouped plural columns, and electrically connect the first electrodes exposed through the openings to one another in the respective grouped plural columns, said wiring films consisting of a material having conductivity and a hydrogen diffusion preventing function.

14. The semiconductor memory device according to claim 13, wherein the wiring films consist of aluminum or a material with aluminum as a principal component.

15. The semiconductor memory device according to claim 13, wherein the wiring films are used as plate lines.

16. The semiconductor memory device according to claim 13, wherein a barrier layer is provided between each of the first electrodes and the wiring films.

* * * * *